United States Patent
Tomita et al.

(10) Patent No.: US 8,066,020 B2
(45) Date of Patent: Nov. 29, 2011

(54) SUBSTRATE CLEANING APPARATUS AND SUBSTRATE CLEANING METHOD

(75) Inventors: Hiroshi Tomita, Yokohama (JP); Hiroaki Yamada, Yokohama (JP); Kunihiro Miyazaki, Oita (JP); Hajime Onoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 801 days.

(21) Appl. No.: 11/588,393

(22) Filed: Oct. 27, 2006

(65) Prior Publication Data

US 2007/0095363 A1   May 3, 2007

(30) Foreign Application Priority Data

Nov. 1, 2005   (JP) .................................. 2005-318292

(51) Int. Cl.
*B08B 3/00*   (2006.01)

(52) U.S. Cl. .......................... 134/108; 134/110; 134/111
(58) Field of Classification Search .......................... None
See application file for complete search history.

(56) References Cited

U.S. PATENT DOCUMENTS

| | | | |
|---|---|---|---|
| 6,055,995 A | 5/2000 | Miyazawa | |
| 6,221,167 B1 * | 4/2001 | Karasawa | 134/1 |
| 6,584,989 B2 | 7/2003 | Taft et al. | |

FOREIGN PATENT DOCUMENTS

| | | |
|---|---|---|
| JP | 6-342780 | 12/1994 |
| JP | 2000-164550 | 6/2000 |
| JP | 2000-228386 | 8/2000 |
| JP | 2002-96012 | 4/2002 |
| JP | 2002-110605 | 4/2002 |

OTHER PUBLICATIONS

JPO translation of JP 2002-096012 to Muraoka et al. retrieved Jan. 29, 2011.*
Notification of Reasons for Rejection issued by the Japanese Patent Office of May 7, 2010, for Japanese Patent Application No. 2005-318292, and English-language translation thereof.

* cited by examiner

*Primary Examiner* — Michael Kornakov
*Assistant Examiner* — Eric Golightly
(74) *Attorney, Agent, or Firm* — Finnegan, Henderson, Farabow, Garrett & Dunner, L.L.P.

(57) ABSTRACT

A substrate cleaning apparatus, comprises a process tank that holds a mixture containing a hydrogen peroxide solution and sulfuric acid and is used for cleaning a substrate immersed in said mixture; circulation piping that extends between a primary side of said process tank on which said mixture is injected into said process tank and a secondary side of said process tank on which said mixture is discharged from said process tank and has a pump for causing circulation of said mixture; a heater disposed in said circulation piping configured to heat said mixture to a predetermined temperature; a chemical injection pipe configured to inject a hydrogen peroxide solution into said circulation piping at a position between the primary side of said process tank and a secondary side, which is a downstream side, of said heater; and a filter disposed in said circulation piping configured to remove particles in said mixture.

5 Claims, 5 Drawing Sheets

SUBSTRATE CLEANING APPARATUS AND SUBSTRATE CLEANING METHOD

CROSS-REFERENCE TO RELATED APPLICATION

This application is based upon and claims the benefit of priority from the prior Japanese Patent Application No. 2005-318292, filed on Nov. 1, 2005, the entire contents of which are incorporated herein by reference.

BACKGROUND OF THE INVENTION

1. Field of the Invention

The present invention relates to a substrate cleaning apparatus and a substrate cleaning method that clean a substrate, in particular, a semiconductor wafer.

2. Background of the Invention

Typically, a resist on a semiconductor wafer substrate is removed (cleaned off) by immersing the semiconductor wafer in a chemical (resist remover) in a remover tank of a substrate cleaning apparatus.

In a conventional cleaning technique, for example, an SPM (sulfuric acid-hydrogen peroxide mixture) resist removing process, a mixture (SPM cleaning fluid) containing sulfuric acid and hydrogen peroxide in a certain proportion is first produced. Typically, to improve the resist removing capability, the SPM cleaning fluid serving as a remover is kept at a high temperature equal to or higher than 100 degrees Celsius, for example. Generally, hydrogen peroxide ($H_2O_2$) thermally decomposes into water ($H_2O$) and oxygen ($O_2$). In addition, hydrogen peroxide has a boiling point of 150 degrees Celsius and evaporates when heated to such a high temperature. Hydrogen peroxide tends to thermally decompose and evaporate at high temperatures in this way, so that the oxidation capability (resist removing capability) of the SPM cleaning fluid is lowered on the time passes.

According to an existing measure against this, before introduction of a semiconductor wafer or the concentration of the SPM cleaning fluid is managed, a predetermined amount of hydrogen peroxide solution is additionally injected into an inner tank (wafer process tank) or an outer tank (overflow receiving tank) of a process tank at desired intervals, thereby maintaining the oxidation capability of the SPM cleaning fluid.

A method of managing the hydrogen peroxide concentration uses a concentration monitor. However, since the concentration has to be always kept constant, the amount of usage of the hydrogen peroxide solution and sulfuric acid increases substantially.

According to the method in which the hydrogen peroxide solution is introduced before introduction of the semiconductor wafer described above, it takes long before the hydrogen peroxide solution is sufficiently mixed with the circulating mixture to form a uniform SPM mixture containing the hydrogen peroxide solution and sulfuric acid.

In the case where the hydrogen peroxide solution is introduced into the inner tank as described above, the hydrogen peroxide solution having a low specific gravity cannot be effectively mixed with sulfuric acid and overflows into the outer tank, and thus, a desired resist removing capability cannot be obtained.

Similarly, in the case where the hydrogen peroxide solution is introduced into the outer tank, since the hydrogen peroxide solution is not effectively mixed, the hydrogen peroxide solution having a low specific gravity is not mixed with the sulfuric acid and remains separated in the upper part of the outer tank. Thus, it takes a predetermined time before a uniform mixture of sulfuric acid and the hydrogen peroxide solution is formed, or it is difficult to feed all the introduced hydrogen peroxide solution to a circulation piping because some of the hydrogen peroxide solution is discharged from the overflow pipe rather than being fed to the circulation piping.

Furthermore, for example, a conventional substrate cleaning apparatus using the SPM cleaning fluid has a process tank that holds a mixture containing a hydrogen peroxide solution and sulfuric acid and is used for cleaning a substrate immersed in the mixture, circulation piping that extends between a primary side of the process tank on which the mixture is injected into the process tank and a secondary side of the process tank on which the mixture is discharged from the process tank and has a pump for causing circulation of the mixture, a filter disposed in the circulation piping for removing particles in the mixture, a chemical tank for additionally injecting a mixture of a hydrogen peroxide solution and sulfuric acid into the process tank, and a heater for heating the mixture in the chemical tank (see Japanese Patent Laid-Open No. 6-342780, for example).

However, in the conventional substrate cleaning apparatus, the mixture is heated by the heater to a temperature higher than a temperature required in the process tank before the mixture is injected into the process tank. Thus, the SPM cleaning fluid heated to the high temperature thermally decomposes and evaporates, so that the hydrogen peroxide concentration of the SPM cleaning fluid decreases. As a result, a desired SPM cleaning fluid cannot be obtained in the process tank.

As described above, the conventional technique described above has a problem that the SPM cleaning fluid cannot have a required resist removing capability, and the amount of the hydrogen peroxide solution additionally injected into the SPM cleaning fluid cannot be optimized.

SUMMARY OF THE INVENTION

According one aspect of the present invention, there is provided: a substrate cleaning apparatus, comprising a process tank that holds a mixture containing a hydrogen peroxide solution and sulfuric acid and is used for cleaning a substrate immersed in said mixture; circulation piping that extends between a primary side of said process tank on which said mixture is injected into said process tank and a secondary side of said process tank on which said mixture is discharged from said process tank and has a pump for causing circulation of said mixture; a heater disposed in said circulation piping configured to heat said mixture to a predetermined temperature; a chemical injection pipe configured to inject a hydrogen peroxide solution into said circulation piping at a position between the primary side of said process tank and a secondary side, which is a downstream side, of said heater; and a filter disposed in said circulation piping configured to remove particles in said mixture.

According other aspect of the present invention, there is provided: a substrate cleaning method, in which a mixture containing a hydrogen peroxide solution and sulfuric acid is held in a process tank in which a substrate is cleaned by being immersed in said mixture, and said mixture is made to circulate in circulation piping that has a pump and extends between a primary side of said process tank on which said mixture is injected into said process tank and a secondary side of said process tank on which said mixture is discharged from said process tank, the method comprising heating said mixture to a predetermined temperature by a heater disposed in said circulation piping; injecting a hydrogen peroxide solution from a chemical injection pipe into said circulation piping at a position between the primary side of said process tank and a secondary side, which is a downstream side, of said heater; and removing particles in said mixture by a filter disposed in said circulation piping.

DETAILED DESCRIPTION

In the following, embodiments applying the present invention will be described with reference to the drawings. In the following description of the embodiments, the present invention is applied to an SPM cleaning fluid, which is a mixture of a hydrogen peroxide solution and sulfuric acid. However, the present invention can be equally applied to other mixtures containing a hydrogen peroxide solution and sulfuric acid, such as a cleaning fluid containing a hydrogen peroxide solution, sulfuric acid and ozone gas.

First Embodiment

Figure 1:
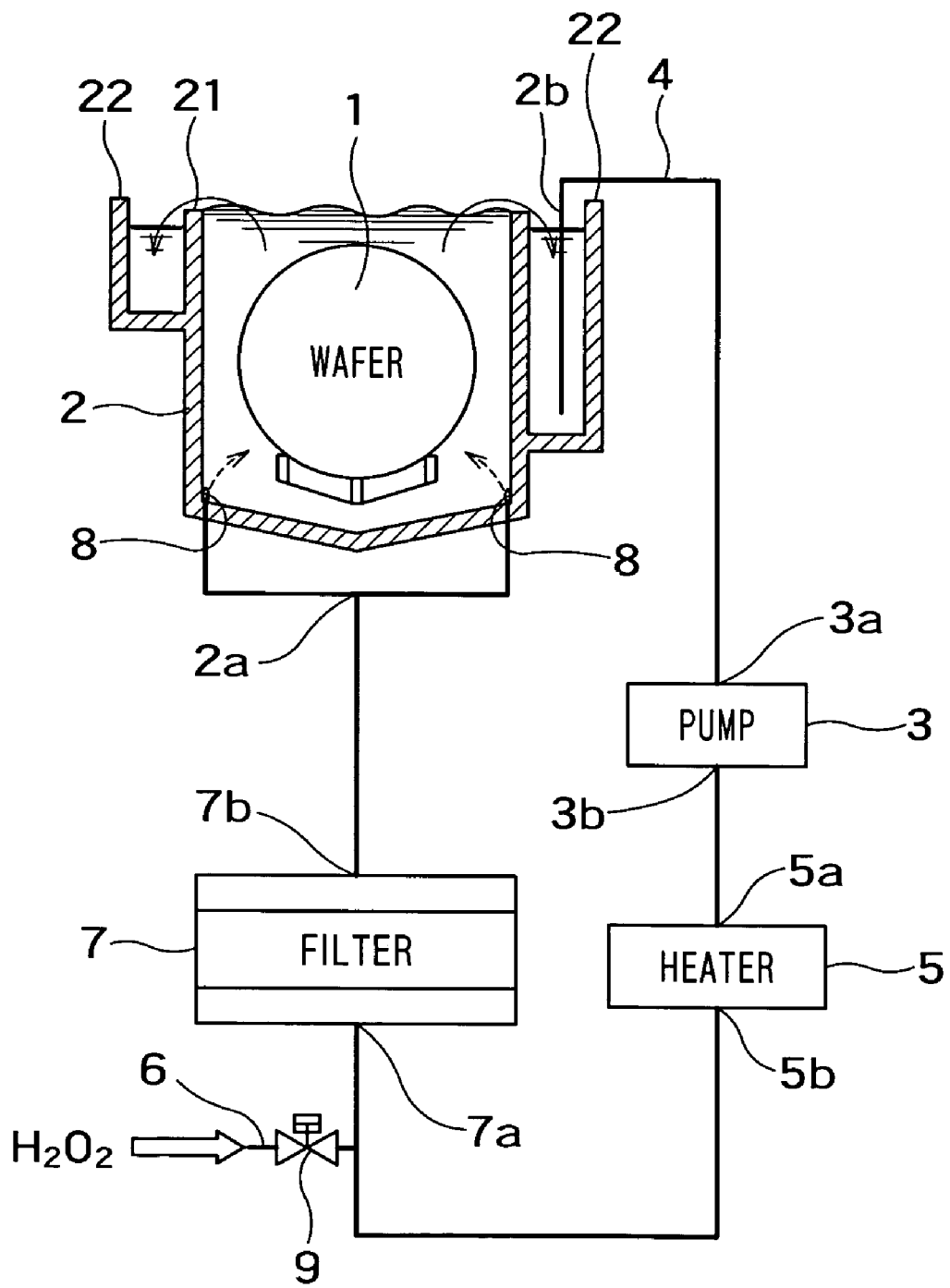
FIG. 1 is a diagram showing a configuration of essential parts of a semiconductor cleaning apparatus according to a First Embodiment of the present invention.

FIG. 1 is a diagram showing a configuration of essential parts of a semiconductor cleaning apparatus (substrate cleaning apparatus) according to a First Embodiment of the present invention.

As shown in FIG. 1, a semiconductor cleaning apparatus 100 has a process tank 2 that holds an SPM cleaning fluid, which is a mixture of a hydrogen peroxide solution and sulfuric acid, and is used for cleaning a semiconductor wafer 1 (substrate) immersed in the SPM cleaning fluid, circulation piping 4 that extends between a primary side 2a of the process tank 2 on which the SPM cleaning fluid is injected into the process tank 2 and a secondary side 2b of the process tank 2 on which the SPM cleaning fluid is discharged from the process tank 2 and has a pump 3 for causing circulation of the SPM cleaning fluid, a heater 5 that is disposed in the circulation piping 4 for heating the SPM cleaning fluid to a predetermined temperature, a chemical injection pipe 6 for injecting a hydrogen peroxide solution into the circulation piping 4, and a filter 7 that is disposed in the circulation piping 4 for removing particles from the SPM cleaning fluid.

An inner tank 21 of the process tank 2 houses the semiconductor wafer 1 and holds the SPM cleaning fluid for cleaning of the semiconductor wafer 1. The inner tank 21 has a predetermined volume so that the semiconductor wafer 1 can be immersed in the SPM cleaning fluid, and the SPM cleaning fluid circulating in the circulation piping 4 is injected into the inner tank 21 through an inlet port 8. The held SPM cleaning fluid overflows from the inner tank 21 into an outer tank 22. When the fluid in the outer tank 22 reaches a certain level, the pump 3 is activated to discharge the SPM cleaning fluid from a primary side 3a to a secondary side 3b by suction, thereby causing circulation of the chemical. Thus, the level of the SPM cleaning fluid in the inner tank 21 is kept constant.

The heater 5 controls the heating temperature of the SPM cleaning fluid flowing thereto from a primary side 5a, thereby keeping the temperature of the SPM cleaning fluid to be injected into the inner tank 21 at a desired temperature.

The filter 7 is disposed between the primary side 2a of the process tank 2 and a secondary side 5b of the heater 5. The filter membrane area of the filter 7 is larger than the cross sectional area of the circulation piping 4, and in addition to removing particles from the SPM cleaning fluid flowing into the filter 7 from a primary side 7a and passing through the filter membrane, the filter 7 causes convection and mixture of the SPM cleaning fluid before discharging the SPM cleaning fluid from a secondary side 7b thereof.

The chemical injection pipe 6 is connected to the circulation piping 4 at a position between the primary side 7a, which is the upstream side, of the filter 7 and the secondary side 5b of the heater 5. The amount of the hydrogen peroxide solution to be injected is adjusted by opening or closing a valve 9 disposed in the chemical injection pipe 6. By opening the valve 9, the hydrogen peroxide solution can be injected into the circulation piping 4.

The hydrogen peroxide solution injected from the primary side 7a of the filter 7 passes through the filter membrane, thereby being efficiently mixed. Thus, the time from the start of injection of the hydrogen peroxide solution into the SPM cleaning fluid until the hydrogen peroxide concentration of the SPM cleaning fluid becomes constant can be substantially reduced.

Furthermore, since the hydrogen peroxide solution is injected into the circulation piping 4 in such a manner that the hydrogen peroxide solution does not pass through the heater 5, at which the SPM cleaning fluid circulating in the circulation piping 4 has the highest temperature, excessive thermal decomposition and evaporation of the hydrogen peroxide in the SPM cleaning fluid can be suppressed.

Figure 2:
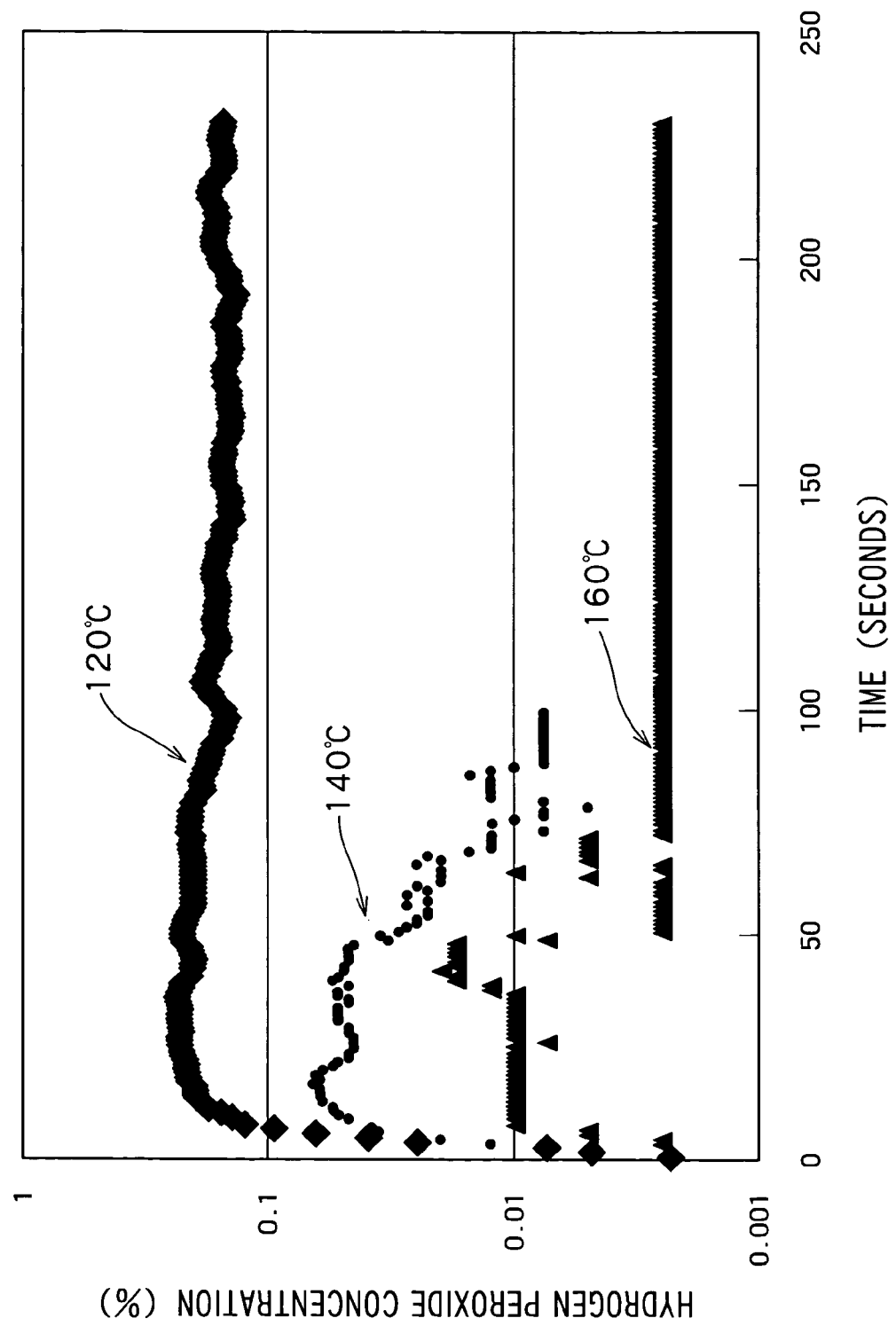
FIG. 2 shows a relationship between the hydrogen peroxide concentration of the SPM cleaning fluid and the elapsed time from the injection of the hydrogen peroxide at various temperatures.

FIG. 2 shows a relationship between the hydrogen peroxide concentration of the SPM cleaning fluid and the elapsed time from the injection of the hydrogen peroxide at various temperatures. As shown in FIG. 2, if the temperature of the SPM cleaning fluid is 120° C., the hydrogen peroxide concentration remains constant, or stable, even after a lapse of 200 seconds from the start of injection of the hydrogen peroxide solution. If the temperature of the SPM cleaning fluid is 140 degrees Celsius, the hydrogen peroxide concentration decreases because of thermal decomposition and evaporation after a lapse of 50 seconds from the start of injection. Furthermore, if the temperature of the SPM cleaning fluid is 160 degrees Celsius, which is higher than the boiling point of hydrogen peroxide, 150 degrees Celsius, the hydrogen peroxide concentration is low even at the peak thereof and decreases with time.

As described above, if the temperature of the SPM cleaning fluid is equal to or higher than 120 degrees Celsius, thermal decomposition and evaporation of hydrogen peroxide tend to easily occur. Thus, it is essential that the SPM cleaning fluid is injected into the inner tank 21 to clean the semiconductor wafer as soon as possible after mixture, and the SPM cleaning fluid is not excessively heated.

Thus, injecting the hydrogen peroxide solution from the chemical injection pipe 6 into the circulation piping 4 at a position between the primary side 7a, or the upstream side, of the filter 7 and the secondary side 5b of the heater 5 as described above is particularly effective in the case where the SPM cleaning fluid is heated by the heater 5 so that the temperature of the SPM cleaning fluid in the inner tank 21 of the process tank 2 falls within a range of 120 to 160 degrees Celsius.

Figure 3:
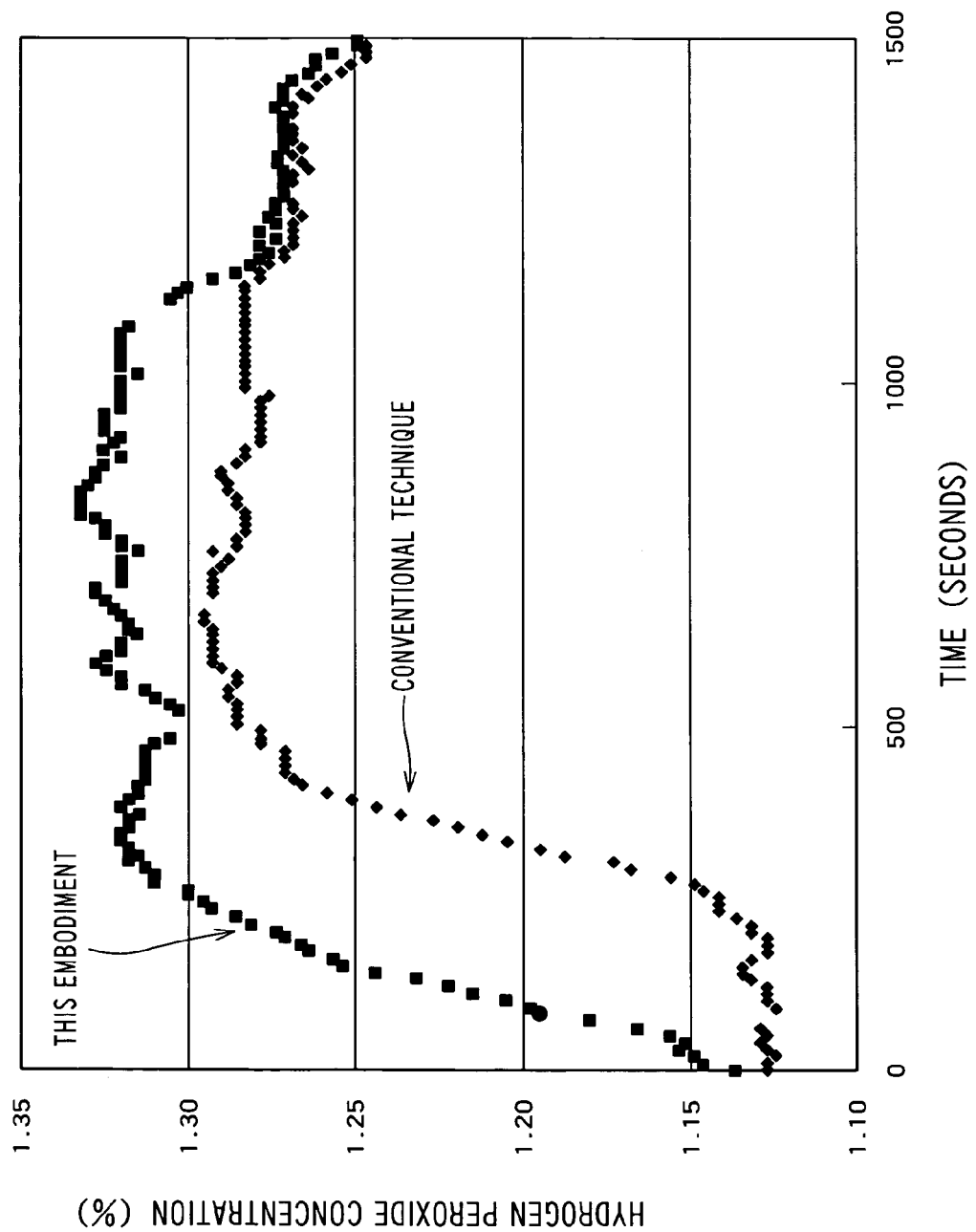
FIG. 3 shows a relationship between the hydrogen peroxide concentration of the SPM cleaning fluid in the inner tank and the elapsed time from the start of injection of the hydrogen peroxide solution.

FIG. 3 shows a relationship between the hydrogen peroxide concentration of the SPM cleaning fluid in the inner tank 21 and the elapsed time from the start of injection of the hydrogen peroxide solution. Here, the temperature of the SPM cleaning fluid in the inner tank 21 is 120 degrees Celsius.

As shown in FIG. 3, according to a conventional technique involving additionally injecting the hydrogen peroxide solution into the outer tank 22, the SPM cleaning fluid is not sufficiently mixed in the outer tank 22, so that it takes about 500 seconds until the hydrogen peroxide concentration reaches the maximum value and becomes constant. On the other hand, according to this embodiment, the SPM cleaning solution and the hydrogen peroxide solution additionally injected are sufficiently mixed by the filter 7, so that the hydrogen peroxide concentration reaches the maximum value and becomes constant in about 250 seconds, which is a half of the time required by the conventional technique.

In addition, the maximum value of the hydrogen peroxide concentration according to this embodiment is higher than that according to the conventional technique. That is, according to the conventional technique, since the SPM cleaning fluid is heated by the heater 5 after injection of the hydrogen peroxide solution, thermal decomposition and evaporation of the hydrogen peroxide tend to easily occur. However, it is considered that, according to this embodiment, since injection of the hydrogen peroxide solution occurs on the secondary side of the heater 5, the injected hydrogen peroxide solution is not excessively heated, and thermal decomposition and evaporation of the hydrogen peroxide are suppressed.

Thus, a desired hydrogen peroxide concentration of the SPM cleaning fluid can be achieved by additional injection of a smaller amount of hydrogen peroxide solution.

As described above, the semiconductor cleaning apparatus 100 configured as described above can achieve a required resist removing capability of the SPM cleaning fluid and optimize the amount of the hydrogen peroxide solution additionally injected to the SPM cleaning fluid.

Figure 4:
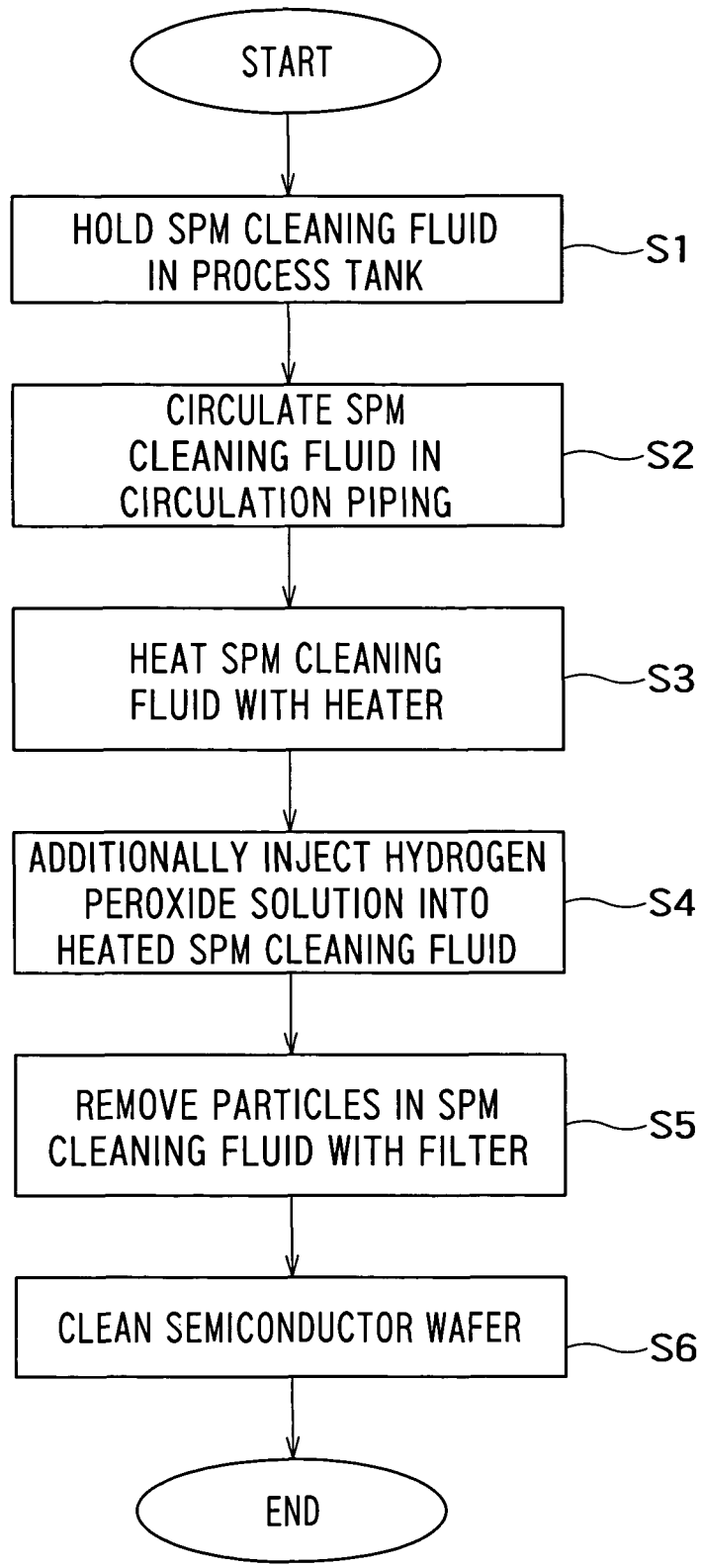
FIG. 4 is a flowchart for illustrating a semiconductor cleaning method according to a First Embodiment of the present invention.

A substrate cleaning method (semiconductor cleaning method) of the semiconductor cleaning apparatus 100 configured as described above will be described. FIG. 4 is a flowchart for illustrating a semiconductor cleaning method according to this embodiment.

As shown in FIG. 4, first, the SPM cleaning fluid is held in the process tank 2 for cleaning the semiconductor wafer 1 (step 1).

Then, the pump 3 is activated to cause circulation of the SPM cleaning fluid in the circulation piping 4 extending between the primary side 2a and the secondary side 2b of the process tank 2 (step 2).

Then, the SPM cleaning fluid is heated to a predetermined temperature by the heater 5 disposed in the circulation piping 4 (step 3).

Then, the hydrogen peroxide solution is additionally injected from the chemical injection pipe 6 into the circulation piping 4 at a position between the primary side 7a of the filter 7 and the secondary side 5b of the heater 5 where the heated SPM cleaning fluid flows (step 4). The amount of the hydrogen peroxide solution injected is adjusted by opening or closing the valve 9.

Then, particles in the SPM cleaning fluid are removed by the filter 7 disposed in the circulation piping 4 (step 5). By passing the SPM cleaning fluid through the filter membrane in this step, convection of the SPM cleaning fluid and the injected hydrogen peroxide solution occurs, and the SPM cleaning fluid and the hydrogen peroxide solution are sufficiently mixed before being supplied into the process tank 2.

Then, the semiconductor wafer 1 is introduced into the process tank 2 and cleaned with the SPM cleaning fluid having a predetermined concentration set by additional injection of the hydrogen peroxide solution (step 6). The additional injection of the hydrogen peroxide solution may occur each time a new semiconductor wafer 1 is introduced, or the hydrogen peroxide concentration of the SPM cleaning fluid in the process tank 2 may be managed to inject the hydrogen peroxide solution at an appropriate time.

As described above, in the semiconductor cleaning apparatus and the semiconductor cleaning method according to this embodiment, the hydrogen peroxide solution is additionally injected from the chemical injection pipe into the circulation piping at a position between the primary side of the filter for removing particles and the secondary side of the heater for heating the SPM cleaning fluid to a predetermined temperature, thereby suppressing thermal decomposition and evaporation of the hydrogen peroxide. Thus, a required resist removing capability of the SPM cleaning fluid can be achieved, and the amount of the hydrogen peroxide solution additionally injected to the SPM cleaning fluid can be optimized.

Second Embodiment

With regard to the First Embodiment, there has been described a configuration in which the chemical injection pipe for injecting the hydrogen peroxide solution is connected to the circulation piping at a position between the primary side of the filter for removing particles and the secondary side of the heater for heating the SPM cleaning fluid to a predetermined temperature. However, according to a Second Embodiment described below, a chemical injection pipe for injecting a hydrogen peroxide solution is connected between a primary side of a filter and a secondary side of a heater, in particular, connected to the primary side of the filter.

Figure 5:
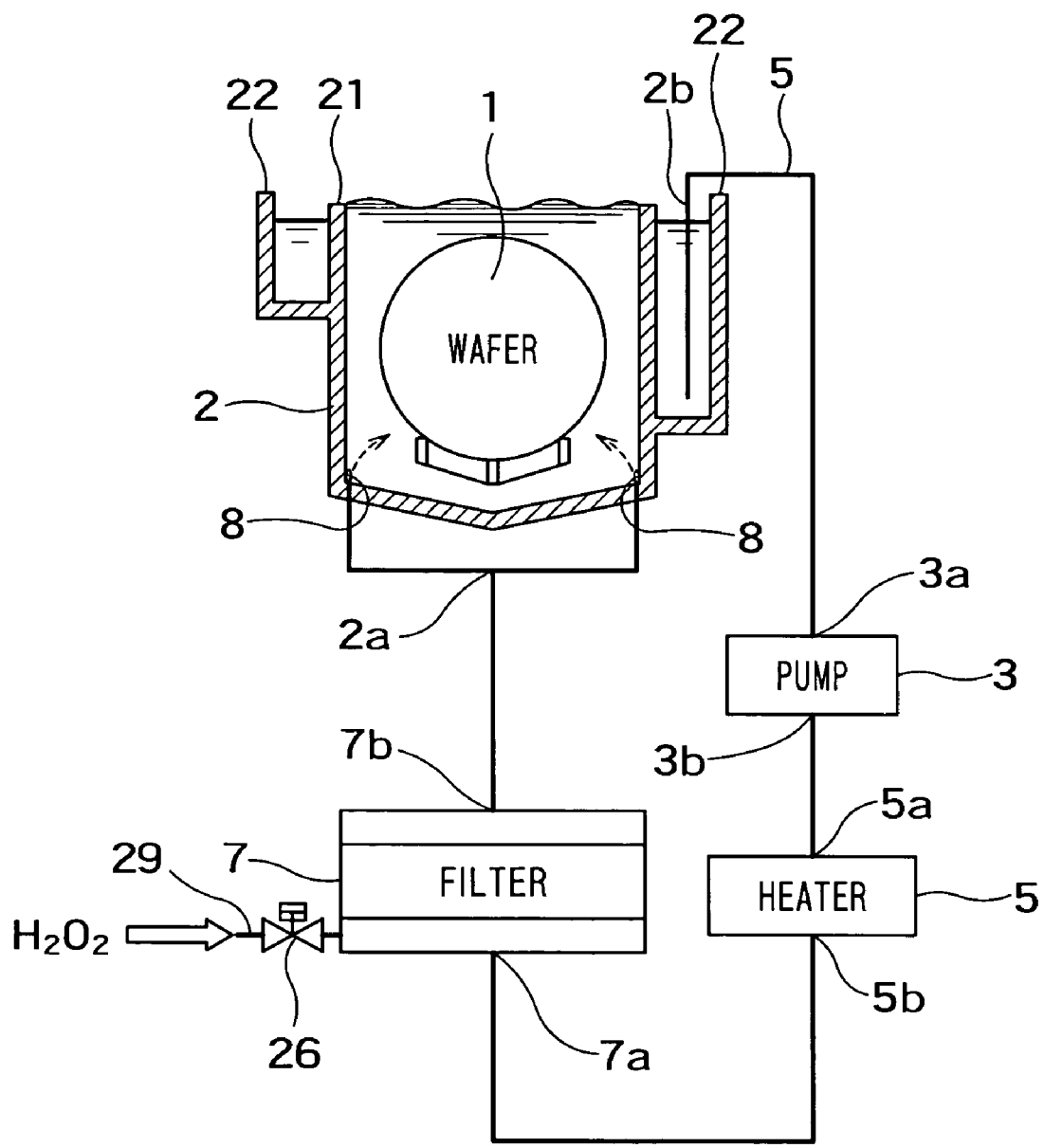
FIG. 5 shows a configuration of essential parts of a semiconductor cleaning apparatus according to the Second Embodiment of the present invention.

FIG. 5 shows a configuration of essential parts of a semiconductor cleaning apparatus according to the Second Embodiment, which is an aspect of the present invention. In this drawing, the same reference numerals as in the First Embodiment denote the same parts in the First Embodiment.

As shown in FIG. 5, a semiconductor cleaning apparatus 200 has a process tank 2 that holds an SPM cleaning fluid, which is a mixture of a hydrogen peroxide solution and sulfuric acid, and is used for cleaning a semiconductor wafer 1 immersed in the SPM cleaning fluid, circulation piping 4 that extends between a primary side 2a of the process tank 2 on which the SPM cleaning fluid is injected into the process tank 2 and a secondary side 2b of the process tank 2 on which the SPM cleaning fluid is discharged from the process tank 2 and has a pump 3 for causing circulation of the SPM cleaning fluid, a heater 5 that is disposed in the circulation piping 4 for heating the SPM cleaning fluid to a predetermined temperature, a chemical injection pipe 26 for injecting a hydrogen peroxide solution into the circulation piping 4, and a filter 7 for removing particles from the SPM cleaning fluid.

The chemical injection pipe 26 is connected to a primary side 7a of the filter 7. The amount of the hydrogen peroxide solution to be injected is adjusted by opening or closing a valve 29 disposed in the chemical injection pipe 26. By opening the valve 29, the hydrogen peroxide solution can be injected into the circulation piping 4.

As in the First Embodiment, the hydrogen peroxide solution injected from the primary side 7a of the filter 7 is efficiently mixed by passing through the filter membrane. Thus, the time from the start of injection of the hydrogen peroxide solution into the SPM cleaning fluid until the hydrogen peroxide concentration of the SPM cleaning fluid becomes constant can be substantially reduced.

Furthermore, since the hydrogen peroxide solution is injected into the circulation piping 4 in such a manner that the hydrogen peroxide solution does not pass through the heater 5, at which the SPM cleaning fluid circulating in the circulation piping 4 has the highest temperature, excessive thermal decomposition and evaporation of the hydrogen peroxide in the SPM cleaning fluid can be suppressed.

The semiconductor cleaning method of the semiconductor cleaning apparatus configured described above is the same as in the First Embodiment.

As described above, in the semiconductor cleaning apparatus and the semiconductor cleaning method according to this embodiment, the hydrogen peroxide solution is additionally injected from the chemical injection pipe into the circulation piping at a position between the primary side of the filter for removing particles and the secondary side of the heater for heating the SPM cleaning fluid to a predetermined temperature, thereby suppressing thermal decomposition and evaporation of the hydrogen peroxide. Thus, a required resist removing capability of the SPM cleaning fluid can be achieved, and the amount of the hydrogen peroxide solution additionally injected to the SPM cleaning fluid can be optimized.

With regard to the above embodiments, there have been described configurations in which the hydrogen peroxide solution is injected into the circulation piping at a position between the primary side of the filter for removing particles and the secondary side of the heater for heating the SPM cleaning fluid to a predetermined temperature. However, any configuration in which the hydrogen peroxide solution is injected into the circulation piping at least between the primary side of the process tank and the secondary side of the heater can suppress thermal decomposition and evaporation of hydrogen peroxide.

In addition, in the above description of the embodiments, the substrate to be cleaned is a semiconductor wafer. However, the present invention can be applied to other conductive or insulating substrates or the like.

What is claimed is:

1. A substrate cleaning apparatus, comprising:
a process tank that holds a mixture containing a hydrogen peroxide solution and sulfuric acid and is used for cleaning a substrate immersed in said mixture;
circulation piping that extends between a primary side of said process tank on which said mixture is injected into said process tank and a secondary side of said process tank on which said mixture is discharged from said process tank and has a pump for causing circulation of said mixture;
a heater disposed in said circulation piping configured to heat said mixture to a predetermined temperature;
a filter disposed in said circulation piping and disposed between the primary side of said process tank and said heater, the filter being configured to remove particles in said mixture; and
a chemical injection pipe configured to inject a hydrogen peroxide solution into said circulation piping at a position between said filter and said heater,
wherein, while the heater is on, the injected hydrogen peroxide solution is filtered by the filter and enters the primary side of the process tank before the injected hydrogen peroxide solution is heated by the heater.

2. The substrate cleaning apparatus according to claim 1, wherein the temperature of said mixture in said process tank falls within a range of 120 degrees Celsius to 160 degrees Celsius.

3. The substrate cleaning apparatus according to claim 1, wherein said substrate is a semiconductor wafer.

4. The substrate cleaning apparatus according to claim 1, wherein said chemical injection pipe is connected to said circulation piping at an upstream side of said filter.

5. The substrate cleaning apparatus according to claim 1, wherein said chemical injection pipe is connected to an upstream side of said filter.

* * * * *